(12) United States Patent
Gu

(10) Patent No.: US 12,636,868 B2
(45) Date of Patent: May 26, 2026

(54) SUPPORT FILM AND FORMING METHOD THEREOF, DISPLAY PANEL AND MANUFACTURING METHOD THEREOF

(71) Applicant: BOE Technology Group Co., Ltd., Beijing (CN)

(72) Inventor: Penghao Gu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/805,566

(22) Filed: Aug. 15, 2024

(65) Prior Publication Data

US 2024/0408849 A1    Dec. 12, 2024

Related U.S. Application Data

(62) Division of application No. 17/202,381, filed on Mar. 16, 2021, now Pat. No. 12,097,682.

(30) Foreign Application Priority Data

May 28, 2020    (CN) .......................... 202010470621.1

(51) Int. Cl.

| | |
|---|---|
| *B32B 15/09* | (2006.01) |
| *B32B 7/12* | (2006.01) |
| *B32B 27/08* | (2006.01) |
| *B32B 27/36* | (2006.01) |
| *B32B 37/12* | (2006.01) |
| *B32B 38/00* | (2006.01) |
| *C09J 7/29* | (2018.01) |
| *H10K 77/10* | (2023.01) |
| *H10K 59/80* | (2023.01) |

(52) U.S. Cl.
CPC ................ *B32B 27/36* (2013.01); *B32B 7/12* (2013.01); *B32B 15/09* (2013.01); *B32B 27/08* (2013.01); *B32B 37/12* (2013.01); *B32B 38/0004* (2013.01); *C09J 7/29* (2018.01); *H10K 59/8791* (2023.02); *H10K 77/111* (2023.02); *B32B 2307/51* (2013.01); *B32B 2310/0831* (2013.01); *B32B 2457/20* (2013.01); *C09J 2301/16* (2020.08); *H10K 59/873* (2023.02)

(58) Field of Classification Search
CPC ..................................................... H10K 77/111
See application file for complete search history.

(56) References Cited

U.S. PATENT DOCUMENTS

2022/0376205 A1* 11/2022 Gu ......................... H10K 71/40

* cited by examiner

*Primary Examiner* — Ian A Rummel
(74) *Attorney, Agent, or Firm* — Ling Wu; Stephen Yang; Ling and Yang Intellectual Property

(57) ABSTRACT

A support film for a flexible display panel is provided. The support film includes a first support portion and a second support portion on a first surface of a substrate of the display panel. The first support portion is located in a bonding area, the second support portion extends from a display area to the bonding area, and a groove is provided between the first support portion and the second support portion to expose the first surface. The first support portion includes a first support base material and a first adhesive material, and the first adhesive material adheres the first support base material on the first surface. The second support portion includes a second support base material and a second adhesive material, the second adhesive material adheres the second support base material on the first surface.

17 Claims, 11 Drawing Sheets

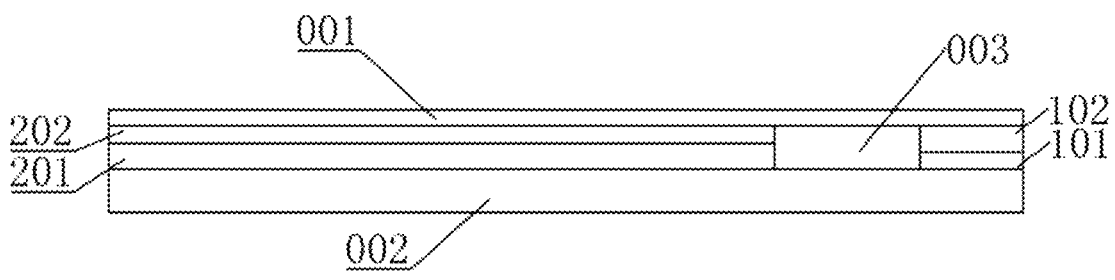

FIG. 1

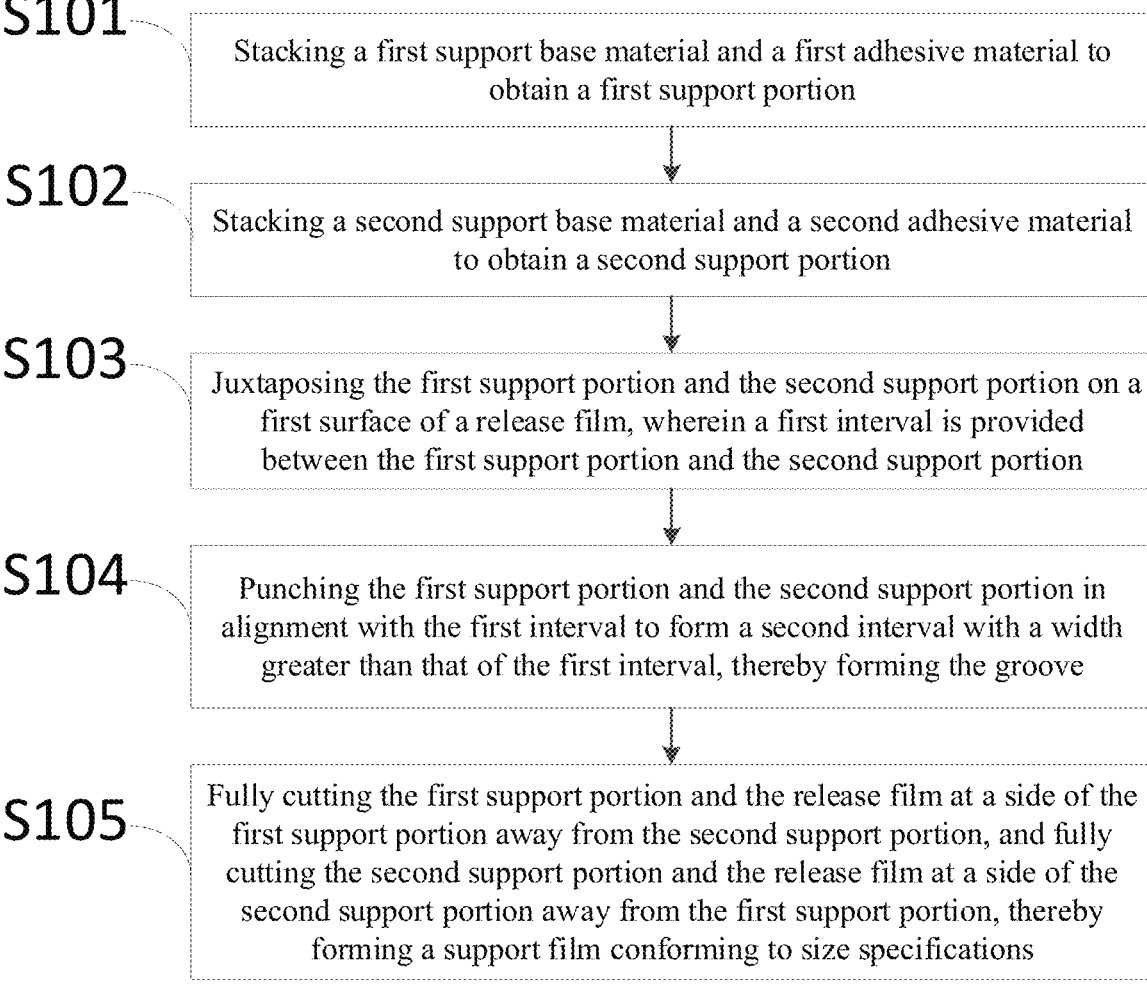

S101 — Stacking a first support base material and a first adhesive material to obtain a first support portion

S102 — Stacking a second support base material and a second adhesive material to obtain a second support portion

S103 — Juxtaposing the first support portion and the second support portion on a first surface of a release film, wherein a first interval is provided between the first support portion and the second support portion

S104 — Punching the first support portion and the second support portion in alignment with the first interval to form a second interval with a width greater than that of the first interval, thereby forming the groove

S105 — Fully cutting the first support portion and the release film at a side of the first support portion away from the second support portion, and fully cutting the second support portion and the release film at a side of the second support portion away from the first support portion, thereby forming a support film conforming to size specifications

FIG. 2

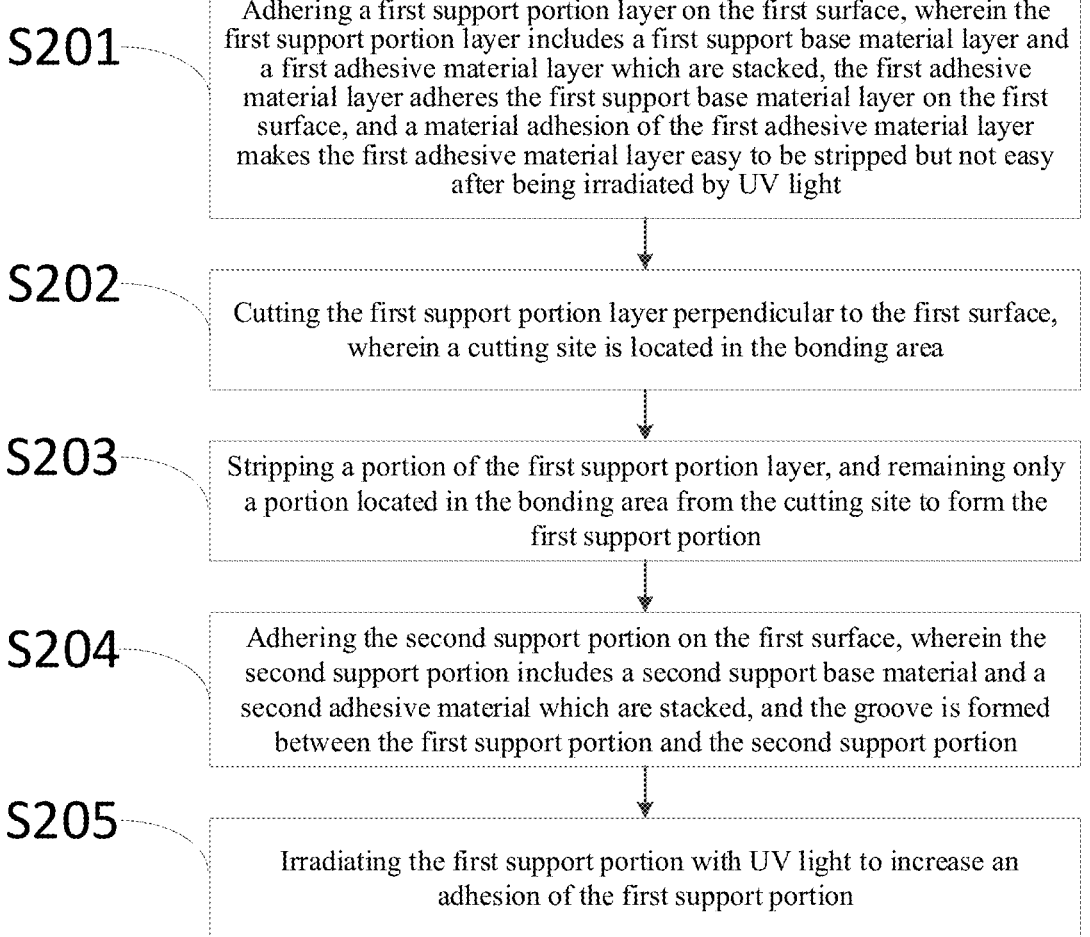

S201 — Adhering a first support portion layer on the first surface, wherein the first support portion layer includes a first support base material layer and a first adhesive material layer which are stacked, the first adhesive material layer adheres the first support base material layer on the first surface, and a material adhesion of the first adhesive material layer makes the first adhesive material layer easy to be stripped but not easy after being irradiated by UV light S202 — Cutting the first support portion layer perpendicular to the first surface, wherein a cutting site is located in the bonding area S203 — Stripping a portion of the first support portion layer, and remaining only a portion located in the bonding area from the cutting site to form the first support portion S204 — Adhering the second support portion on the first surface, wherein the second support portion includes a second support base material and a second adhesive material which are stacked, and the groove is formed between the first support portion and the second support portion S205 — Irradiating the first support portion with UV light to increase an adhesion of the first support portion

FIG. 7

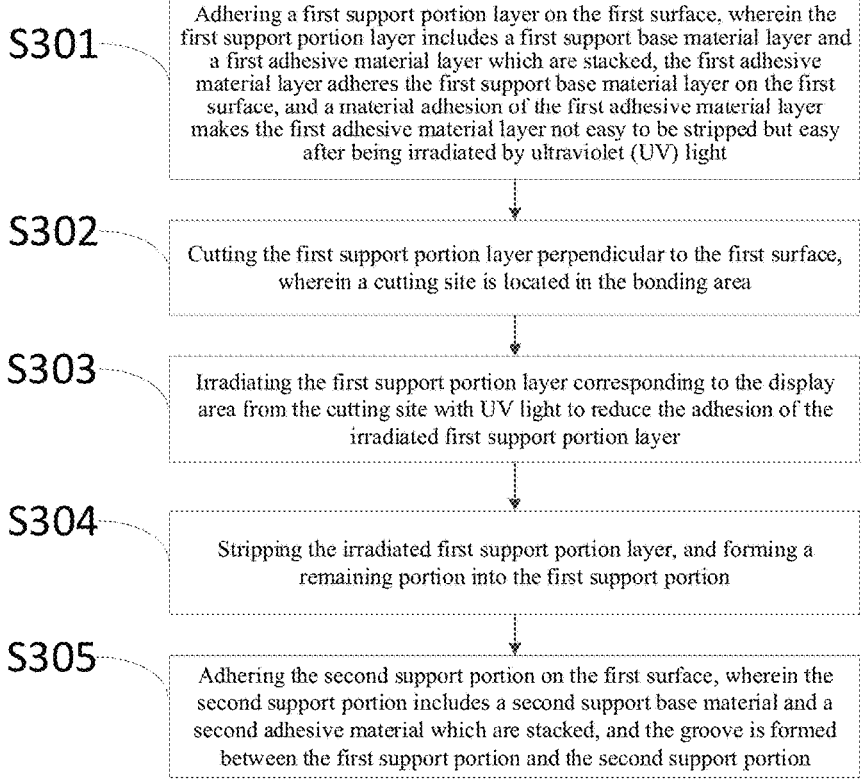

S301 — Adhering a first support portion layer on the first surface, wherein the first support portion layer includes a first support base material layer and a first adhesive material layer which are stacked, the first adhesive material layer adheres the first support base material layer on the first surface, and a material adhesion of the first adhesive material layer makes the first adhesive material layer not easy to be stripped but easy after being irradiated by ultraviolet (UV) light S302 — Cutting the first support portion layer perpendicular to the first surface, wherein a cutting site is located in the bonding area S303 — Irradiating the first support portion layer corresponding to the display area from the cutting site with UV light to reduce the adhesion of the irradiated first support portion layer S304 — Stripping the irradiated first support portion layer, and forming a remaining portion into the first support portion S305 — Adhering the second support portion on the first surface, wherein the second support portion includes a second support base material and a second adhesive material which are stacked, and the groove is formed between the first support portion and the second support portion

FIG. 8

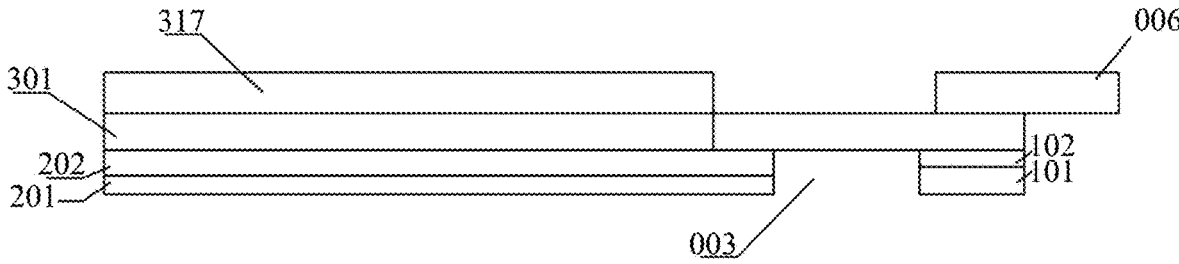

FIG. 9

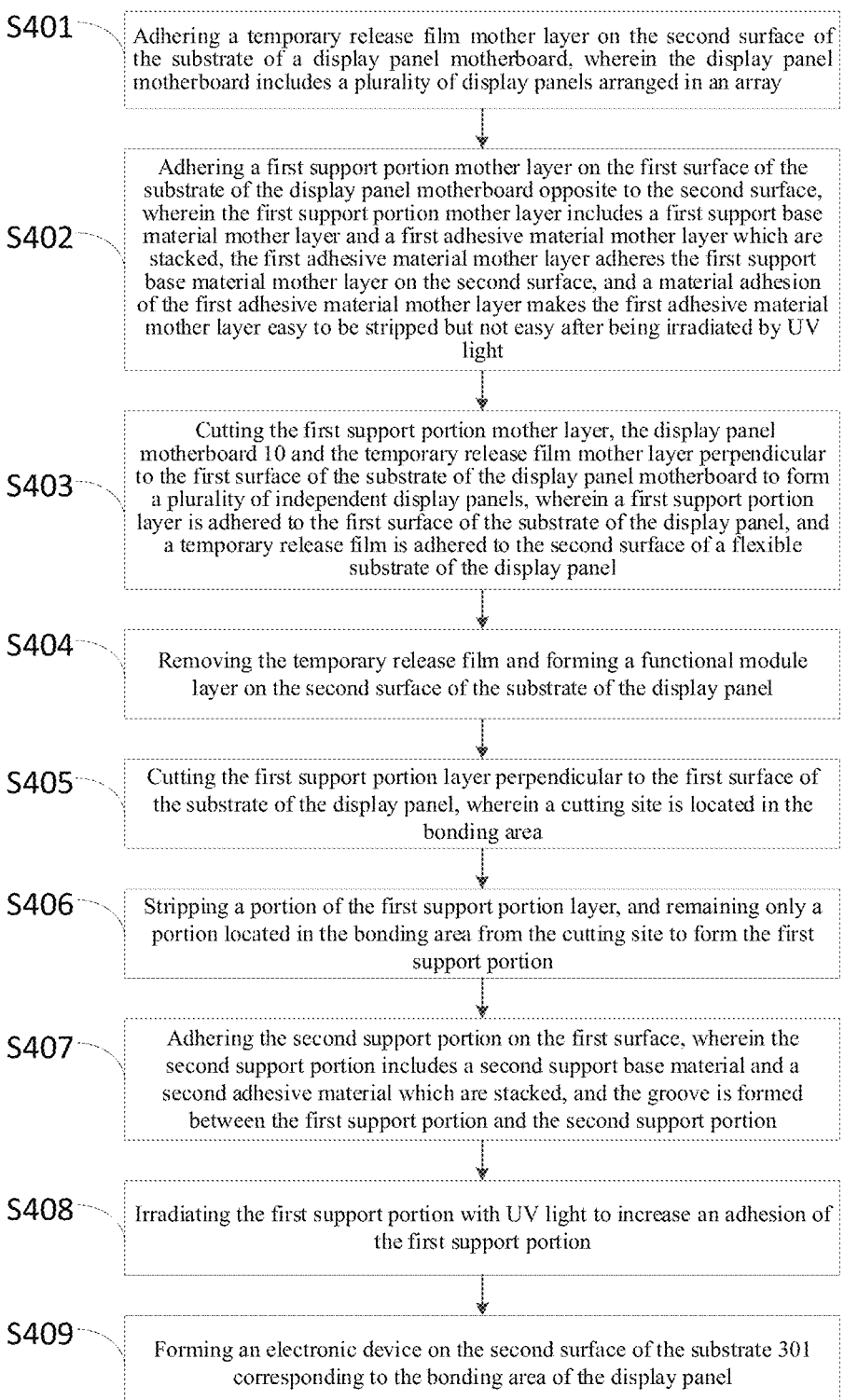

S401   Adhering a temporary release film mother layer on the second surface of the substrate of a display panel motherboard, wherein the display panel motherboard includes a plurality of display panels arranged in an array S402   Adhering a first support portion mother layer on the first surface of the substrate of the display panel motherboard opposite to the second surface, wherein the first support portion mother layer includes a first support base material mother layer and a first adhesive material mother layer which are stacked, the first adhesive material mother layer adheres the first support base material mother layer on the second surface, and a material adhesion of the first adhesive material mother layer makes the first adhesive material mother layer easy to be stripped but not easy after being irradiated by UV light S403   Cutting the first support portion mother layer, the display panel motherboard 10 and the temporary release film mother layer perpendicular to the first surface of the substrate of the display panel motherboard to form a plurality of independent display panels, wherein a first support portion layer is adhered to the first surface of the substrate of the display panel, and a temporary release film is adhered to the second surface of a flexible substrate of the display panel S404   Removing the temporary release film and forming a functional module layer on the second surface of the substrate of the display panel S405   Cutting the first support portion layer perpendicular to the first surface of the substrate of the display panel, wherein a cutting site is located in the bonding area S406   Stripping a portion of the first support portion layer, and remaining only a portion located in the bonding area from the cutting site to form the first support portion S407   Adhering the second support portion on the first surface, wherein the second support portion includes a second support base material and a second adhesive material which are stacked, and the groove is formed between the first support portion and the second support portion S408   Irradiating the first support portion with UV light to increase an adhesion of the first support portion S409   Forming an electronic device on the second surface of the substrate 301 corresponding to the bonding area of the display panel

FIG. 11

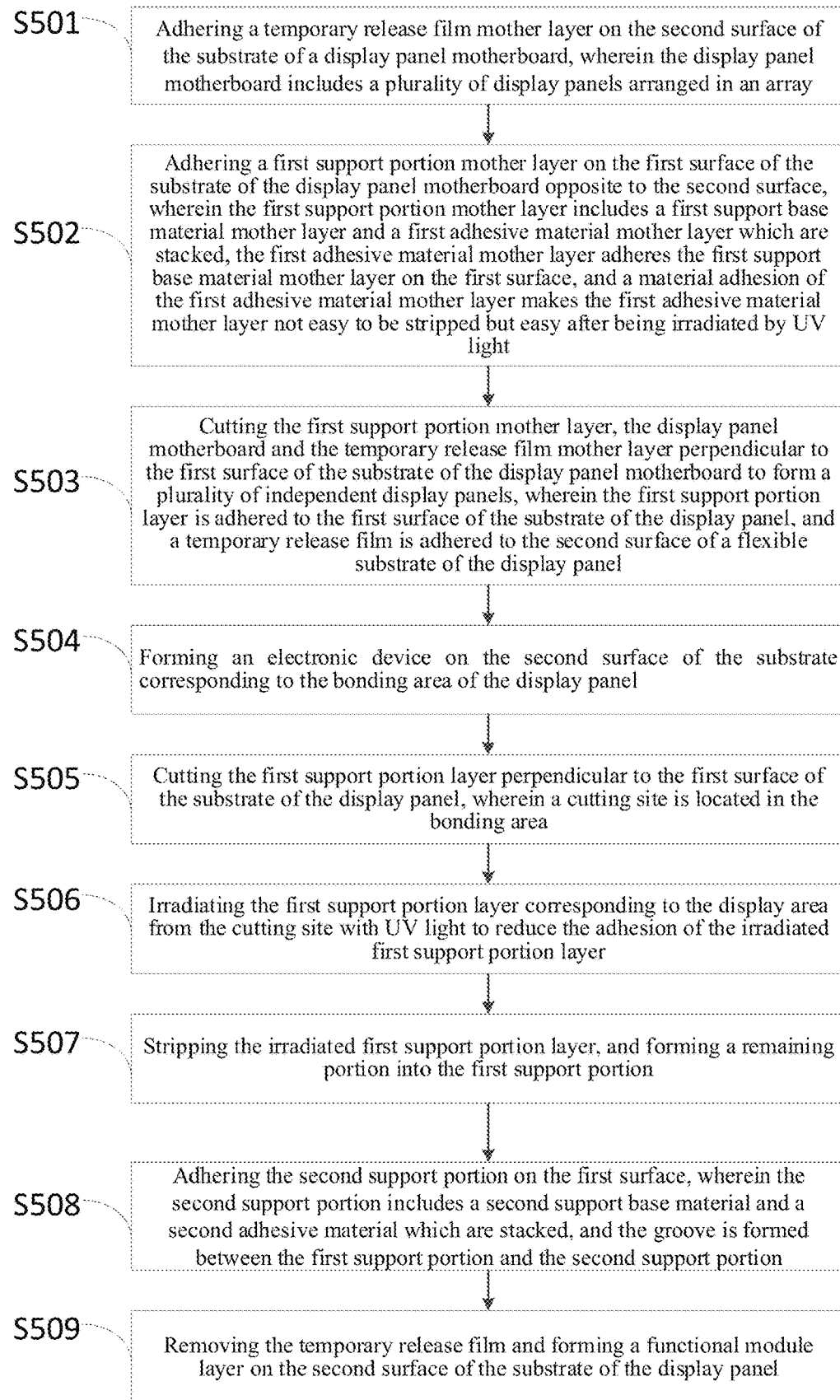

S501 — Adhering a temporary release film mother layer on the second surface of the substrate of a display panel motherboard, wherein the display panel motherboard includes a plurality of display panels arranged in an array S502 — Adhering a first support portion mother layer on the first surface of the substrate of the display panel motherboard opposite to the second surface, wherein the first support portion mother layer includes a first support base material mother layer and a first adhesive material mother layer which are stacked, the first adhesive material mother layer adheres the first support base material mother layer on the first surface, and a material adhesion of the first adhesive material mother layer makes the first adhesive material mother layer not easy to be stripped but easy after being irradiated by UV light S503 — Cutting the first support portion mother layer, the display panel motherboard and the temporary release film mother layer perpendicular to the first surface of the substrate of the display panel motherboard to form a plurality of independent display panels, wherein the first support portion layer is adhered to the first surface of the substrate of the display panel, and a temporary release film is adhered to the second surface of a flexible substrate of the display panel S504 — Forming an electronic device on the second surface of the substrate corresponding to the bonding area of the display panel S505 — Cutting the first support portion layer perpendicular to the first surface of the substrate of the display panel, wherein a cutting site is located in the bonding area S506 — Irradiating the first support portion layer corresponding to the display area from the cutting site with UV light to reduce the adhesion of the irradiated first support portion layer S507 — Stripping the irradiated first support portion layer, and forming a remaining portion into the first support portion S508 — Adhering the second support portion on the first surface, wherein the second support portion includes a second support base material and a second adhesive material which are stacked, and the groove is formed between the first support portion and the second support portion S509 — Removing the temporary release film and forming a functional module layer on the second surface of the substrate of the display panel

FIG. 18

SUPPORT FILM AND FORMING METHOD THEREOF, DISPLAY PANEL AND MANUFACTURING METHOD THEREOF

CROSS-REFERENCE TO RELATED APPLICATION(S)

This application is a divisional application of U.S. patent application Ser. No. 17/202,381 filed on Mar. 16, 2021, which claims the priority of Chinese Patent Application No. 202010470621.1 filed to the CNIPA on May 28, 2020. The above-identified applications are incorporated by reference herein in their entireties.

TECHNICAL FIELD

Embodiments of the present disclosure relate to, but are not limited to, the technical field of display, in particular to a support film and a forming method thereof, a display panel and a manufacturing method thereof.

BACKGROUND

Organic Light Emitting Display (OLED) has gradually become the first choice of screen, which has many advantages, such as self-illumination, high luminous efficiency, short response time and high definition and contrast, and can also ensure the flexibility and adaptability of the screen. With the development of flexible display screen, people have higher and higher expectations for foldable and curved display products.

SUMMARY

The following is a summary of the subject matter described in detail in the present disclosure. This summary is not intended to limit the protection scope of the claims.

A first aspect of the present disclosure provides a support film for a flexible display panel, the display panel including a display area and a bonding area, wherein the support film includes:

a first support portion and a second support portion which are juxtaposed on a first surface of a substrate of the display panel, wherein the first support portion is located in the bonding area, the second support portion extends from the display area to the bonding area, and a groove is provided between the first support portion and the second support portion to expose the first surface, the first support portion includes: a first support base material and a first adhesive material which are stacked, wherein the first adhesive material adheres the first support base material on the first surface; the second support portion includes: a second support base material and a second adhesive material which are stacked, wherein the second adhesive material adheres the second support base material on the first surface; wherein, the first support base material has an elastic modulus different from that of the second support base material, the first support base material has a thickness different from that of the second support base material, and the first support portion has a thickness equal to that of the second support portion.

In an exemplary embodiment, the elastic modulus of the first support base material is 2 Gpa to 8 Gpa, and the elastic modulus of the first adhesive material is 100 Kpa to 400 Kpa.

In a case where the display panel is a curved display panel, the elastic modulus of the second support base material is 10 Mpa to 500 Mpa.

In a case where the display panel is a folded display panel, the elastic modulus of the second support base material is 100 Gpa to 400 Gpa.

The elastic modulus of the second adhesive material is 1 Kpa to 400 Kpa.

In an exemplary embodiment, the first support base material is a polyester resin material, and the second support base material is metal or polymer material.

In an exemplary embodiment, a transmittance of the first support base material for visible light is not less than 30%.

In an exemplary embodiment, when the elastic modulus of the first support base material is greater than that of the second support base material, the thickness of the second support base material is greater than that of the first support base material, and the thickness of the second adhesive material is smaller than that of the first adhesive material, so that the sum of the thicknesses of the first support base material and the first adhesive material is the same as that of the second support base material and the second adhesive material; and when the elastic modulus of the first support base material is smaller than that of the second support base material, the thickness of the second support base material is smaller than that of the first support base material, and the thickness of the second adhesive material is greater than that of the first adhesive material, so that the sum of the thicknesses of the first support base material and the first adhesive material is the same as that of the second support base material and the second adhesive material.

A second aspect of the present disclosure provides a forming method of the support film, including the following steps: adhering a first support portion layer on the first surface, wherein the first support portion layer includes a first support base material layer and a first adhesive material layer which are stacked, the first adhesive material layer adheres the first support base material layer on the first surface, and a material adhesion of the first adhesive material layer makes the first adhesive material layer easy to be stripped but not easy after being irradiated by ultraviolet (UV) light; cutting the first support portion layer perpendicular to the first surface, wherein a cutting site is located in the bonding area; stripping a portion of the first support portion layer, and remaining only a portion located in the bonding area from the cutting site to form the first support portion; adhering the second support portion on the first surface, wherein the second support portion includes a second support base material and a second adhesive material which are stacked, and the groove is formed between the first support portion and the second support portion; and irradiating the first support portion with UV light to increase an adhesion of the first support portion.

A third aspect of the present disclosure provides a forming method of the support film, including the following steps: adhering a first support portion layer on the first surface, wherein the first support portion layer includes a first support base material layer and a first adhesive material layer which are stacked, the first adhesive material layer adheres the first support base material layer on the first surface, and a material adhesion of the first adhesive material layer makes the first adhesive material layer not easy to be stripped but easy after being irradiated by ultraviolet (UV) light; cutting the first support portion layer perpendicular to the first surface, with a cutting site in the bonding area, irradiating the first support portion layer corresponding to the display area from the cutting site with UV light to reduce the adhesion of the irradiated first support portion layer; stripping the irradiated first support portion layer, and forming a remaining portion into the first support portion; and adhering the second support portion on the first surface, wherein the second support portion includes a second support base material and a second adhesive material which are stacked, and the groove is formed between the first support portion and the second support portion.

A fourth aspect of the present disclosure provides a display panel, including: a substrate; the support film formed on a first surface of the substrate as set forth in the first aspect of the present disclosure; and a functional module layer formed on a second surface of the substrate opposite to the first surface.

A fifth aspect of the present disclosure provides a manufacturing method of the display panel according to the fourth aspect of the present disclosure, including the following steps:

adhering a temporary release film mother layer on the second surface of the substrate of the display panel motherboard, wherein the display panel motherboard includes a plurality of display panels arranged in an array;

adhering a first support portion mother layer on the first surface of the substrate of the display panel motherboard opposite to the second surface, wherein the first support portion mother layer includes a first support base material mother layer and a first adhesive material mother layer which are stacked, the first adhesive material mother layer adheres the first support base material mother layer on the first surface, and a material adhesion of the first adhesive material mother layer makes the first adhesive material mother layer easy to be stripped but not easy after being irradiated by ultraviolet (UV) light;

cutting the first support portion mother layer, the display panel motherboard and the temporary release film mother layer perpendicular to the first surface of the substrate of the display panel motherboard to form a plurality of independent display panels, wherein a first support portion layer is adhered to the first surface of the substrate of the display panel, and a temporary release film is adhered to the second surface of a flexible substrate of the display panel, and the first support portion layer includes a first support base material layer and a first adhesive material layer which are stacked;

removing the temporary release film and forming a functional module layer on the second surface of the substrate of the display panel;

cutting the first support portion layer perpendicular to the first surface of the substrate of the display panel, wherein a cutting site is located in the bonding area;

stripping a portion of the first support portion layer, and remaining only a portion located in the bonding area from the cutting site to form the first support portion;

adhering the second support portion on the first surface, wherein the second support portion includes a second support base material and a second adhesive material which are stacked, and the groove is formed between the first support portion and the second support portion;

irradiating the first support portion with UV light to increase an adhesion of the first support portion; and forming an electronic device on the second surface of the substrate corresponding to the bonding area of the display panel.

A sixth aspect of the present disclosure provides a manufacturing method of the display panel according to the fourth aspect of the present disclosure, including the following steps:

adhering a temporary release film mother layer on the second surface of the substrate of the display panel motherboard, wherein the display panel motherboard includes a plurality of display panels arranged in an array;

adhering a first support portion mother layer on the first surface of the substrate of the display panel motherboard opposite to the second surface, wherein the first support portion mother layer includes a first support base material mother layer and a first adhesive material mother layer which are stacked, the first adhesive material mother layer adheres the first support base material mother layer on the first surface, and a material adhesion of the first adhesive material mother layer makes the first adhesive material mother layer not easy to be stripped but easy after being irradiated by UV light;

cutting the first support portion mother layer, the display panel motherboard and the temporary release film mother layer perpendicular to the first surface of the substrate of the display panel motherboard to form a plurality of independent display panels, wherein a first support portion layer is adhered to the first surface of the substrate of the display panel, and a temporary release film is adhered to the second surface of a flexible substrate of the display panel, and the first support portion layer includes a first support base material layer and a first adhesive material layer which are stacked;

removing the temporary release film and forming an electronic device on the second surface of the substrate corresponding to the bonding area of the display panel;

cutting the first support portion layer perpendicular to the first surface of the substrate of the display panel, wherein a cutting site is located in the bonding area;

irradiating the first support portion layer corresponding to the display area from the cutting site with UV light to reduce the adhesion of the irradiated first support portion layer;

stripping the irradiated first support portion layer, and forming a remaining portion into the first support portion;

adhering the second support portion on the first surface, wherein the second support portion includes a second support base material and a second adhesive material which are stacked, and the groove is formed between the first support portion and the second support portion; and forming a functional module layer on the second surface of the substrate of the display panel.

A seventh aspect of the present disclosure provides a support film for a flexible display panel, including: a release film; a first support portion and a second support portion which are juxtaposed on a first surface of the release film, wherein a groove is provided between the first support portion and the second support portion to expose the first surface, wherein, the first support portion includes: a first support base material and a first adhesive material which are stacked, wherein the first adhesive material adheres the first support base material on the first surface; the second support portion includes: a second support base material and a second adhesive material which are stacked, wherein the second adhesive material adheres the second support base material on the first surface; wherein, the first support base material has an elastic modulus different from that of the second support base material, the first support base material has a thickness different from that of the second support base material, and the first support portion has a thickness equal to that of the second support portion.

In an exemplary embodiment, the support film further includes a protective film adhered to a side of the first support portion and a side of the second support portion away from the release film.

In an exemplary embodiment, the elastic modulus of the first support base material is 2 Gpa to 8 Gpa, and the elastic modulus of the first adhesive material is 100 Kpa to 400 Kpa.

In a case where the display panel is a curved display panel, the elastic modulus of the second support base material is 10 Mpa to 500 Mpa.

In a case where the display panel is a folded display panel, the elastic modulus of the second support base material is 100 Gpa to 400 Gpa.

The elastic modulus of the second adhesive material is 1 Kpa to 400 Kpa.

In an exemplary embodiment, a transmittance of the first support base material for visible light is not less than 30%.

In an exemplary embodiment, when the elastic modulus of the first support base material is greater than that of the second support base material, the thickness of the second support base material is greater than that of the first support base material, and the thickness of the second adhesive material is smaller than that of the first adhesive material, so that the sum of the thicknesses of the first support base material and the first adhesive material is the same as that of the second support base material and the second adhesive material; and when the elastic modulus of the first support base material is smaller than that of the second support base material, the thickness of the second support base material is smaller than that of the first support base material, and the thickness of the second adhesive material is greater than that of the first adhesive material, so that the sum of the thicknesses of the first support base material and the first adhesive material is the same as that of the second support base material and the second adhesive material.

An eighth aspect of the present disclosure provides a manufacturing method of a support film, including the following steps:

stacking a first support base material and a first adhesive material to obtain a first support portion;

stacking a second support base material and a second adhesive material to obtain a second support portion;

juxtaposing the first support portion and the second support portion on a first surface of a release film, wherein a first interval is provided between the first support portion and the second support portion;

punching the first support portion and the second support portion in alignment with the first interval to form a second interval with a width greater than that of the first interval, thereby forming a groove; and fully cutting the first support portion and the release film at a side of the first support portion away from the second support portion, and fully cutting the second support portion and the release film at a side of the second support portion away from the first support portion, thereby forming a support film conforming to size specifications.

In an exemplary embodiment, the method further includes: adhering a protective film on a side of the first support portion and a side of the second support portion away from the release film.

Other aspects will become apparent upon reading and understanding accompanying drawings and the detailed description.

BRIEF DESCRIPTION OF THE DRAWINGS

FIG. 1 shows a schematic structural diagram of a support film for a flexible display panel according to an embodiment of the present disclosure;

FIG. 2 shows a flowchart of steps of a manufacturing method of a support film according to another embodiment of the present disclosure;

FIG. 7 shows a flowchart of steps of a forming method of a support film according to another embodiment of the present disclosure;

FIG. 8 shows a flowchart of steps of a forming method of a support film according to another embodiment of the present disclosure;

FIG. 9 is a schematic structural diagram of layers of a display panel according to another embodiment of the present disclosure;

FIG. 11 shows a flowchart of steps of a manufacturing method of a display panel according to another embodiment of the present disclosure;

FIG. 18 shows a flowchart of steps of a manufacturing method of a display panel according to another embodiment of the present disclosure;

DETAILED DESCRIPTION

Figure 3:
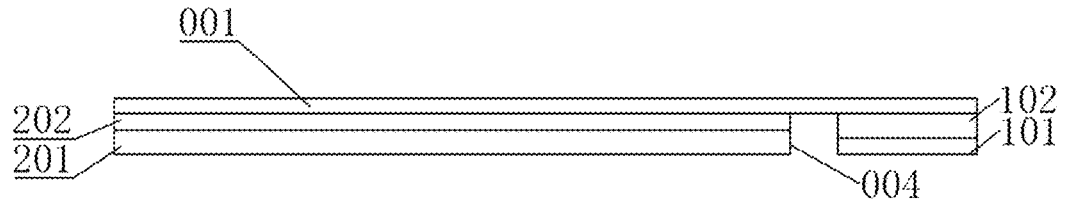
FIG. 3 to FIG. 5 show a flowchart of a manufacturing method of a support film in an embodiment of the present disclosure.

Embodiments of the present disclosure will be described with reference to the accompanying drawings. The embodiments described below are exemplary and are intended to explain the present disclosure, but should not be construed as limitation to the present disclosure. Without conflict, embodiments in the present disclosure and features in the embodiments may be combined with each other arbitrarily.

FIG. 1 is a schematic structural diagram of a support film for a flexible display panel according to an embodiment of the present disclosure. The display panel includes a display area and a bonding area. As shown in FIG. 1, the support film includes a first support portion and a second support portion which are juxtaposed on a first surface of a substrate of the display panel. The first support portion is located in the bonding area, the second support portion extends from the display area to the bonding area, and a groove 003 is provided between the first support portion and the second support portion to expose the first surface.

As shown in FIG. 1, in this embodiment, the first support portion includes a first support base material 101 and a first adhesive material 102 which are stacked, and the first adhesive material 102 adheres the first support base material 101 to the first surface. The second support portion includes a second support base material 201 and a second adhesive material 202 which are stacked, and the second adhesive first support base material 101, and the thickness of the second adhesive material 202 is greater than that of the first adhesive material 102, so that the sum of the thicknesses of the first support base material 101 and the first adhesive material 102 is the same as that of the second support base material 201 and the second adhesive material 202.

Table 1 shows the materials and properties of the first support portion and the second support portion of the support film in this embodiment:

TABLE 1

| Category | First support base material | Material | First adhesive material | Second support base material | | Material | Second adhesive material |
|---|---|---|---|---|---|---|---|
| Elastic modulus | 2 Gpa to 8 Gpa | Optional PET | 100 Kpa to 400 Kpa | Second interval: high 100 Gpa to 400 Gpa | First interval: low 10 Mpa to 500 Mpa | Metal or polymer | 1 Kpa to 400 Kpa |
| Transmittance (550 nm) | 30% and above | | | no requirement | | — | | material 202 adheres the second support base material 201 to the first surface. The elastic modulus of the first support base material 101 is different from that of the second support base material 201, the thickness of the first support base material is different from that of the second support base material, and the thickness of the first support portion is equal to that of the second support portion. In FIG. 1, 001 is a release film, and 002 is a protective film.

In some technologies, flexible display screen film layer usually includes a cover plate, a module functional film layer, a luminescent film layer, a backplane film layer, a flexible substrate, a back support film and other film structures. The support film plays a role in protecting and achieving the corresponding mechanical properties under the display panel. With the development of folding, it is required to weaken the crease. At present, it is verified that the material with high elastic modulus has good resilience, but its optical properties are poor and may not meet the bonding requirements. The curved surface design requires the support film to have low elastic modulus, but the support base material with low elastic modulus has poor stability and process bonding performance.

In order to achieve the folding display panel and meet the different performance requirements of the curved display panel, the materials and properties of the support film are designed accordingly.

In this embodiment, when the elastic modulus of the first support base material 101 is greater than that of the second support base material 201, it may be disposed that the thickness of the second support base material 201 is greater than that of the first support base material 101, and the thickness of the second adhesive material 202 is smaller than that of the first adhesive material 102, so that the sum of the thicknesses of the first support base material 101 and the first adhesive material 102 is the same as that of the second support base material 201 and the second adhesive material 202.

When the elastic modulus of the first support base material 101 is smaller than that of the second support base material 201, it may be disposed that the thickness of the second support base material 201 is smaller than that of the According to Table 1, in this embodiment, the elastic modulus of the first support base material 101 may be 2 Gpa to 8 Gpa, the elastic modulus of the first adhesive material 102 may be 100 Kpa to 400 Kpa, while the elastic modulus of the second support base material 201 may be 10 Mpa to 500 Mpa (low elastic modulus, which may be applied to the case where the display panel is a curved display panel) or 100 Gpa to 400 Gpa (high elastic modulus, which may be applied to the case where the display panel is a folded display panel), and the elastic modulus of the second adhesive material 202 may be 1 Kpa to 400 Kpa. The first adhesive material 102 and the second adhesive material 202 may be made of the same material or different materials. For example, the first adhesive material 102 and the second adhesive material 202 may both be made of acrylic adhesive material. The first support base material 101 and the second support base material 201 may be made of different materials. The first support base material 101 may be made of PET (polyester resin) material, while the second support base material 201 may be made of metal or polymer material. The transmittance of the first support base material 101 for light with a wavelength of 550 nm may be not less than 30%. The light transmittance of the second support base material 201 may not be required. The wavelength of 550 nm in Table 1 is obtained by taking the average value of the wavelength range of visible light (390 nm to 780 nm). The transmittance for light with a wavelength of 550 nm in Table 1 indicates the transmittance for visible light. When the support film in this embodiment is adhered to the display panel, the first support portion may correspond to the bonding area of the display panel. By setting the transmittance of the first support base material 101 for visible light to be not less than 30%, its optical performance may be improved to meet the bonding requirements.

The unit conversion relationship of elastic modulus is 1 $Gpa=10^9$ $Pa=10^3$ $Mpa$, 1 $Mpa=10^3$ $Kpa$, and 1 $Kpa=10^3$ $pa$.

Figure 6:
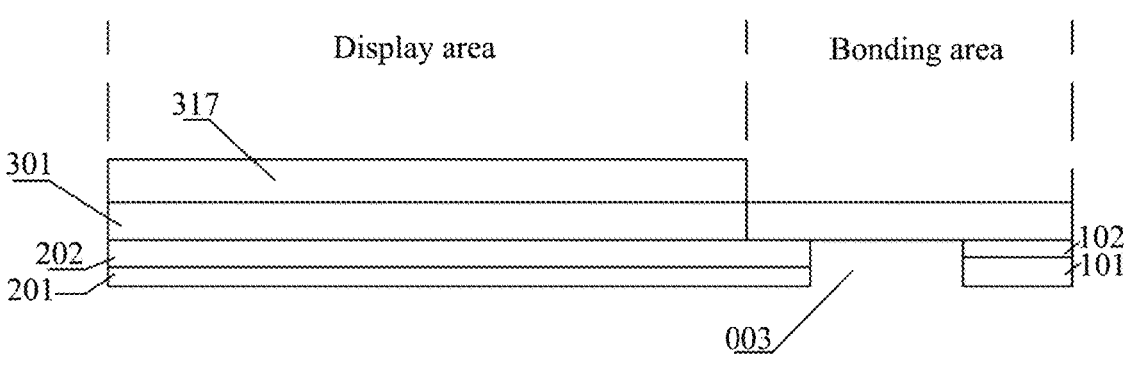
FIG. 6 shows a schematic structural diagram of a support film for a flexible display panel according to another embodiment of the present disclosure.

In the following, the materials and properties of the support film of this embodiment will be described according to the contents shown in Table 1:

When the support film in this embodiment is designed corresponding to a curved display panel, as shown in FIG. 6, if the elastic modulus of the second support base material adhered to the substrate 301 of the display panel is 10 Mpa to 500 Mpa (i.e., low elastic modulus), the second support base material 201 with low elastic modulus will show weaker supportability than the first support base material 101 with elastic modulus between 2 Gpa and 8 Gpa under the same thickness condition. Therefore, in order to improve the supportability of the second support base material 201, the thickness of the second support base material may be increased. For example, the following design may be adopted:

the thickness of the first support base material 101 is X1, the thickness of the first adhesive material 102 is Y1, the thickness of the second support base material 201 is X2, and the thickness of the second adhesive material 202 is Y2.

In order to ensure that the support film will not be uneven when adhered onto the substrate 301 of the display panel, the thicknesses of the first support portion and the second support portion may be kept consistent, and the thickness of the support film may satisfy: X1+Y1=X2+Y2. When the elastic modulus of the second support base material 201 is 10 Mpa to 500 Mpa (i.e., low elastic modulus), the thickness of the second support base material 201 may be increased to satisfy: X2>X1 (for example, the thickness difference between X2 and X1 may be between 30 μm and 100 μm).

In the design corresponding to the curved panel, on the one hand, the stability is improved by increasing the thickness of the second support base material 201 with the elastic modulus of 10 Mpa to 500 Mpa, and on the other hand, the process bonding performance is satisfied by setting the elastic modulus of the first support base material 101 to be between 2 Gpa and 8 Gpa.

In this embodiment, when the support film is designed corresponding to a folded panel, if the elastic modulus of the second support base material 201 is 100 Gpa to 400 Gpa (i.e., high elastic modulus), the second support base material 201 with high elastic modulus will show stronger supportability than the first support base material 101 with elastic modulus of 2 Gpa to 8 Gpa under the same thickness condition. Therefore, in order to improve the supportability of the first support base material 101, the thickness of the first support base material 101 may be increased. For example, the following design may be adopted:

the thickness of the first support base material 101 is X1, the thickness of the first adhesive material 102 is Y1, the thickness of the second support base material 201 is X2, and the thickness of the second adhesive material 202 is Y2.

According to the above, the support film may satisfy X1+Y1=X2+Y2. When the elastic modulus of the second support base material 201 is 100 Gpa to 400 Gpa (i.e., high elastic modulus), X2<X1 may be satisfied by increasing the thickness of the first support base material (the thickness difference between X2 and X1 may be between 30 μm and 100 μm).

In the design corresponding to the folded panel, on the one hand, the stability is improved by increasing the thickness of the first support base material 101, and on the other hand, the elastic modulus of the first support base material 101 is set between 2 Gpa and 8 Gpa, so as to improve its optical performance and meet the bonding requirements.

In an implementation of this embodiment, the thickness of the second support base material 201 may be set between 15 μm and 40 μm, and the thickness of the second adhesive material 202 may be set between 40 μm and 100 μm.

In an implementation of this embodiment, it further includes a protective film 002 adhered to a side of the first support portion and a side of the second support portion away from the release film 001.

Optionally, the protective film 002 adhered to the side of the first support portion and the second support portion away from the release film 001 may protect the first support portion and the second support portion, prevent the first support portion and the second support portion from contacting with external components and bearing the impact of external components, thereby improving the protection of the first support portion and the second support portion.

The technical scheme provided in this embodiment is simple in design, and the materials and properties of the support film are designed accordingly, which may meet the different performance requirements of the folded display panel and the curved display panel respectively. In the design corresponding to the curved panel, on the one hand, the stability is improved by increasing the thickness of the second support base material 201 with the elastic modulus of 10 Mpa to 500 Mpa, and on the other hand, the process bonding performance is satisfied by setting the elastic modulus of the first support base material 101 to be between 2 Gpa and 8 Gpa. In the design corresponding to the folded panel, on the one hand, the stability is improved by increasing the thickness of the first support base material 101, and on the other hand, the optical performance may meet the bonding requirements by setting the elastic modulus of the first support base material 101 to be between 2 Gpa and 8 Gpa and the transmittance of the first support base material 101 for visible light (the light with a wavelength of 550 nm in Table 1) to be not less than 30%.

FIG. 2 shows a flowchart of a manufacturing method of a support film according to another embodiment of the present disclosure. As shown in FIGS. 2 and 3, the method includes the following steps:

S101, stacking a first support base material 101 and a first adhesive material 102 to obtain a first support portion.

In an implementation of this embodiment, the first support base material 101 and the first adhesive material 102 may be combined to form the first support portion by coil molding.

S102, stacking a second support base material 201 and a second adhesive material 202 to obtain a second support portion.

Similar to S101, in S102, the second support base material 201 and the second adhesive material 202 may be combined to form the second support portion by coil molding.

S103, juxtaposing the first support portion and the second support portion on a first surface of a release film 001, wherein a first interval 004 is provided between the first support portion and the second support portion.

In an implementation of this embodiment, as shown in FIG. 3, the first support portion and the second support portion may be supplied from the same roll of release film 001 or from different rolls of release film 001. In the same roll of release film 001, the first support portion and the second support portion may be respectively adhered to the same side surface of the same release film 001. In different rolls of release film 001, the first support portion and the second support portion may be adhered to the surfaces of different release films 001. The first support portion and the second support portion adhered to different release films 001 are torn off separately, and the films are replaced and loaded. The first support portion and the second support portion which have been torn off are adhered to the same side surface of the same release film 001 respectively. The first support portion includes the first adhesive material 102 and the second support portion includes the second adhesive material 200. In order to prevent the first support portion and the second support portion from being adhered together and not easily separated, a first interval 004 may be provided between the first support portion and the second support portion.

Figure 4:
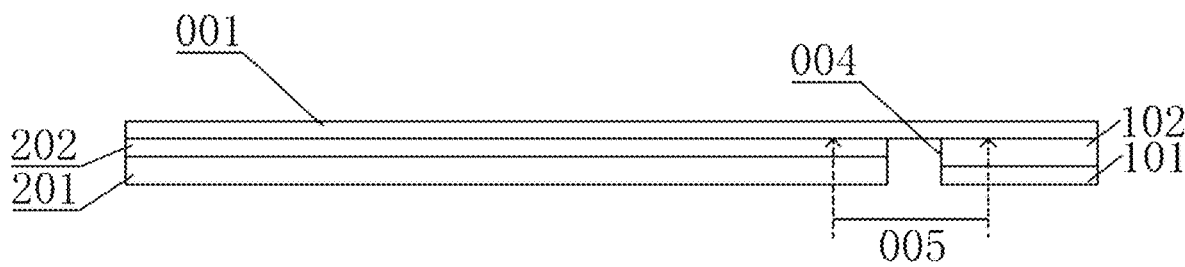
Figure 5:

S104, punching the first support portion and the second support portion in alignment with the first interval 004 to form a second interval 005 with a width greater than that of the first interval 004, thereby forming the groove 003;

The punching process and position in step S104 may be as shown in FIGS. 3-5. The support film in this embodiment may be applied to the substrate 301 of the display panel. After the support film in this embodiment is adhered to the substrate 301 of the display panel, a corresponding groove 003 will be formed between the first support portion and the second support portion. In order to form the groove 003 in advance during the manufacturing process of the support film, in an implementation of this embodiment, as shown in FIG. 4, the first support portion and the second support portion are punched in alignment with the first interval 004 by means of punching process (the punching position may be at the dotted lines as shown in FIG. 4) to form a second interval 005 with a width greater than that of the first interval 004, thereby forming a groove 003 shown in FIG. 5. In the punching process, only the first support portion and the second support portion are punched, and the release film 001 is not punched.

S105, fully cutting the first support portion and the release film 001 at a side of the first support portion away from the second support portion, and fully cutting the second support portion and the release film 001 at a side of the second support portion away from the first support portion, thereby forming a support film conforming to size specifications.

The fully cutting process and position in step S105 may be as shown in FIGS. 5 to 6. In an implementation of this embodiment, since the display panels have different specifications and sizes, in order to correspond to the display panels with different specifications, as shown in FIG. 5, the first support portion, the second support portion and the release film 001 may be fully cut (the fully cutting position may be at the dotted lines shown in FIG. 5), so as to obtain support films with different specifications after cutting. The step after S105 further includes:

S106, adhering a protective film 002 to the side of the first support portion and the second support portion far away from the release film 001 to form a corresponding support film product. Subsequently, it is only needed to adhere the corresponding support film to the substrate 301 of the display panel, and then perform relevant processing.

FIG. 6 shows a schematic structural diagram of a support film for a flexible display panel according to another embodiment of the present disclosure. The display panel includes a display area and a bonding area. As shown in FIG. 6, the support film includes a first support portion and a second support portion which are juxtaposed on a first surface of a substrate 301 of the display panel. The first support portion is located in the bonding area, the second support portion extends from the display area to the bonding area, and a groove 003 is provided between the first support portion and the second support portion to expose the first surface. The first support portion includes a first support base material 101 and a first adhesive material 102 which are stacked, and the first adhesive material 102 adheres the first support base material 101 to the first surface. The second support portion includes a second support base material 201 and a second adhesive material 202 which are stacked, and the second adhesive material 202 adheres the second support base material 201 to the first surface. The elastic modulus of the first support base material 101 is different from that of the second support base material 201, the thickness of the first support base material 101 is different from that of the second support base material 201, and the thickness of first support portion is equal to that of the second support portion.

Optionally, the support film is used to be adhered to the display panel to support the display panel. The display panel may be a flexible organic light-emitting display panel, for example, a flexible OLED display panel. In one example, the display panel may at least include a substrate 301, a driving layer group, a planarization layer 308, an anode, a pixel define layer 310, an organic light-emitting unit and a cathode which are sequentially provided. A voltage is applied between the anode and the cathode to excite carrier migration and act on the organic light-emitting unit so as to emit light. In the example of FIG. 6, only the substrate 301 of the display panel and the polarizer 317 are shown.

In the implementation of this embodiment, the first support portion of the support film may be adhered to the substrate 301 of the display panel corresponding to the bonding area, while the second support portion may be adhered to the substrate 301 of the display panel corresponding to the display area and extending to the bonding area, and a groove 003 may be provided between the first support portion and the second support portion.

In this embodiment, when the elastic modulus of the first support base material 101 is greater than that of the second support base material 201, the thickness of the second support base material 201 is greater than that of the first support base material 101, and the thickness of the second adhesive material 202 is smaller than that of the first adhesive material 102, so that the sum of the thicknesses of the first support base material 101 and the first adhesive material 102 is the same as that of the second support base material 201 and the second adhesive material 202.

When the elastic modulus of the first support base material 101 is smaller than that of the second support base material 201, the thickness of the second support base material 201 is smaller than that of the first support base material 101, and the thickness of the second adhesive material 202 is greater than that of the first adhesive material 102, so that the sum of the thicknesses of the first support base material 101 and the first adhesive material 102 is the same as that of the second support base material 201 and the second adhesive material 202.

The elastic modulus of the first support base material 101 may be 2 Gpa to 8 Gpa, and the elastic modulus of the first adhesive material 102 may be 100 Kpa to 400 Kpa. In the case where the display panel is a curved display panel, the elastic modulus of the second support base material 201 may be 10 Mpa to 500 Mpa. In the case where the display panel is a folded display panel, the elastic modulus of the second support base material 201 may be 100 Gpa to 400 Gpa. The elastic modulus of the second adhesive material 202 may be 1 Kpa to 400 Kpa. The first support base material 101 may be PET, the second support base material 201 may be metal or polymer material, and the transmittance of the first support base material 101 for visible light (light with a wavelength of 550 nm in Table 1) is not less than 30%.

FIG. 7 shows a flowchart of steps of a forming method of a support film according to another embodiment of the present disclosure. As shown in FIG. 7, the forming method includes the following steps:

S201, adhering a first support portion layer on the first surface, wherein the first support portion layer includes a first support base material layer and a first adhesive material layer which are stacked, the first adhesive material layer adheres the first support base material layer on the first surface, and a material adhesion of the first adhesive material layer makes the first adhesive material layer easy to be stripped but not easy after being irradiated by ultraviolet (UV) light.

In the adhering process, first, the first support portion layer is adhered to the first surface of the substrate 301 of the display panel. The first adhesive material layer has a relatively weaker adhesion and thus is easy to be stripped, but it becomes difficult to be stripped after being irradiated by UV light. After being irradiated by UV light, the adhesion of the first adhesive material layer is correspondingly enhanced.

S202, cutting the first support portion layer perpendicular to the first surface, wherein a cutting site is located in the bonding area.

After the first support portion layer is adhered, in order to reserve a position for a second support portion on the substrate 301 of the display panel, the first support portion layer may be cut, and the cutting position is located in the bonding area, which may be selected as required.

S203, stripping a portion of the first support portion layer, and remaining only a portion located in the bonding area from the cutting site to form the first support portion.

After the cutting is completed, since the material adhesion of the first adhesive material layer makes the first adhesive material layer easy to be stripped, the portion located in the bonding area from the cutting site may be remained to form the first support portion, and the rest of the first support portion layer may be stripped to reserve a position for a second support portion on the substrate 301 of the display panel.

S204, adhering the second support portion on the first surface, wherein the second support portion includes a second support base material 201 and a second adhesive material 202 which are stacked, and the groove 003 is formed between the first support portion and the second support portion.

Optionally, in the process of adhering the second support portion to the first surface of the substrate 301 of the display panel, a corresponding support film is first designed according to the type of the display panel. For example, when the display panel is a folded display panel, the specification may be set as a support film with the elastic modulus of the second support base material 201 ranging from 100 Gpa to 400 Gpa, and when the display panel is a curved display panel, the specification may be selected as a support film with the elastic modulus of the second support base material 201 ranging from 10 Mpa to 500 Mpa. After the selection is completed, the corresponding second support portion may be adhered on the first surface.

S205, irradiating the first support portion with UV light to increase an adhesion of the first support portion.

After adhering the second support portion, since the material adhesion of the first adhesive material 102 of the first support portion makes it easy to be stripped, in order to increase the adhesion of the first support portion, the first support portion is irradiated with UV light to increase the adhesion of the first support portion. Here, the increase in the adhesion of the first support portion should be understood as the increase in the adhesion of the first adhesive material 102 in the first support portion.

FIG. 8 shows a flowchart of steps of a forming method of a support film according to another embodiment of the present disclosure. As shown in FIG. 8, the forming method includes the following steps:

S301, adhering a first support portion layer on the first surface, wherein the first support portion layer includes a first support base material layer and a first adhesive material layer which are stacked, the first adhesive material layer adheres the first support base material layer on the first surface, and a material adhesion of the first adhesive material layer makes the first adhesive material layer not easy to be stripped but easy after being irradiated by ultraviolet (UV) light.

In the adhering process, first, the first support portion layer is adhered to the first surface of the substrate 301 of the display panel. The adhesion of the first adhesive material layer makes the first adhesive material layer not easy to be stripped, but easy after being irradiated by UV light. After being irradiated by UV light, the adhesion of the first adhesive material layer is correspondingly weakened.

S302, cutting the first support portion layer perpendicular to the first surface, wherein a cutting site is located in the bonding area.

After the first support portion layer is adhered, in order to reserve a position for a second support portion on the substrate 301 of the display panel, the first support portion layer may be cut, and the cutting position is located in the bonding area, which may be selected as required.

S303, irradiating the first support portion layer corresponding to the display area from the cutting site with UV light to reduce the adhesion of the irradiated first support portion layer.

After cutting is completed, since the material adhesion of the first adhesive material layer corresponding to the first support portion layer of the display area from the cutting site makes the first adhesive material layer not easy to be stripped, in order to reduce the adhesion so as to facilitate stripping, UV light may be applied to reduce the adhesion of the first support portion layer corresponding to the display area from the cutting site.

S304, stripping the irradiated first support portion layer, and forming a remaining portion into the first support portion.

After UV irradiation, the adhesion of the irradiated first support portion layer is weakened, which is convenient for stripping. Therefore, the first support portion layer irradiated by UV light may be stripped to reserve a position for a second support portion on the substrate 301 of the display panel, and the remaining portion forms the first support portion.

S305, adhering the second support portion on the first surface, wherein the second support portion includes a second support base material 201 and a second adhesive material 202 which are stacked, and the groove 003 is formed between the first support portion and the second support portion.

Optionally, in the process of adhering the second support portion to the first surface of the substrate 301 of the display panel, a corresponding support film is first designed according to the type of the display panel. For example, when the display panel is a folded display panel, the specification may be set as a support film with the elastic modulus of the second support base material 201 ranging from 100 Gpa to 400 Gpa, and when the display panel is a curved display panel, the specification may be selected as a support film with the elastic modulus of the second support base material 201 ranging from 10 Mpa to 500 Mpa. After the selection is completed, the corresponding second support portion may be adhered on the first surface.

FIG. 9 shows a schematic structural diagram of layers of a display panel according to another embodiment of the present disclosure. As shown in FIG. 9, the display panel includes a substrate 301, a support film formed on a first surface of the substrate 301, and a functional module layer formed on a second surface of the substrate 301 opposite to the first surface.

Figure 10:
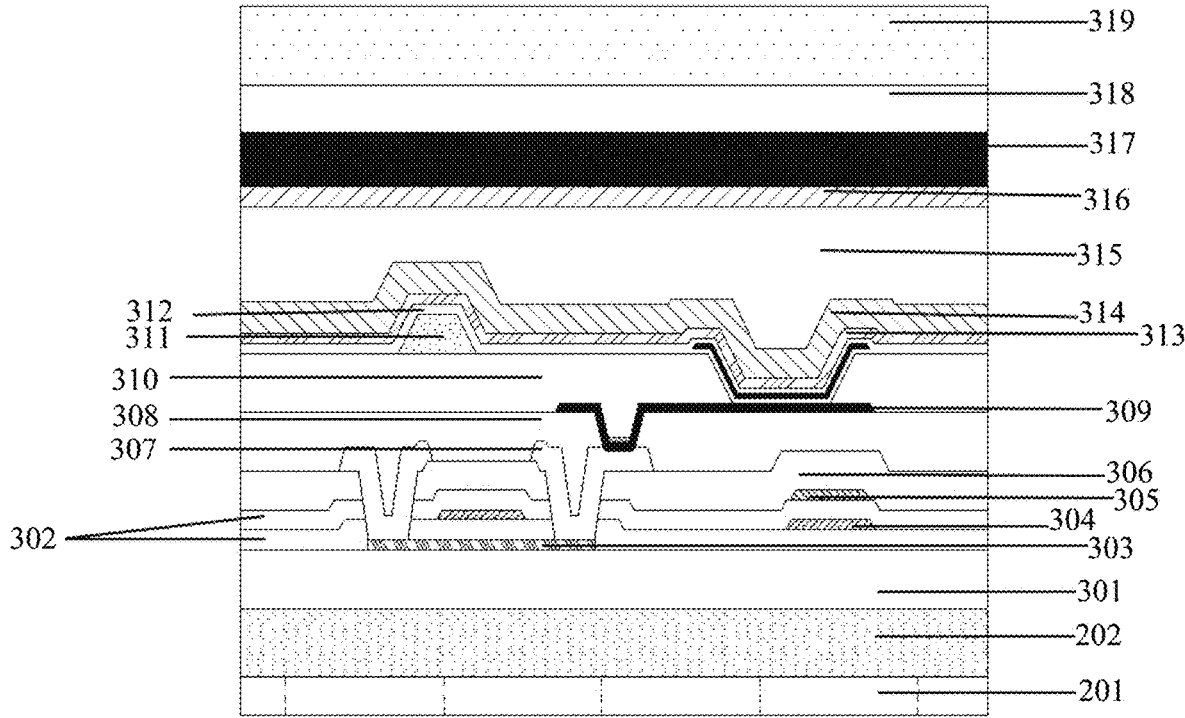
FIG. 10 shows a schematic structural diagram of layers of a display panel in an embodiment of the present disclosure.

In the example of FIG. 9, an electronic device 006 may be formed on the substrate 301, and the functional module layer may include a polarizer 317. In the example of FIG. 10, the display panel may further include a barrier layer 302, a channel layer 303, a first gate 304, a second gate 305, an intermediate layer 306, and a source-drain conductive channel 307 which are formed on the substrate 301; a planarization layer 308, an anode film layer 309, a pixel define layer 310, a spacer support 311, a luminescent material organic film layer 312, and a cathode film layer 313; a first inorganic encapsulation layer 314, a second inorganic encapsulation layer 315, a third inorganic encapsulation layer 316, an optical adhesive layer 318, and a window film 319. FIG. 10 only shows a structure of the layers corresponding to the display area of the display panel, and the structure and principle of this portion are not described in detail here.

FIG. 11 shows a flowchart of steps of a manufacturing method of a display panel according to another embodiment of the present disclosure. As shown in FIG. 11, the manufacturing method includes the following steps:

S401, adhering a temporary release film mother layer on the second surface of the substrate 301 of a display panel motherboard 10, wherein the display panel motherboard 10 includes a plurality of display panels arranged in an array.

Figure 12:
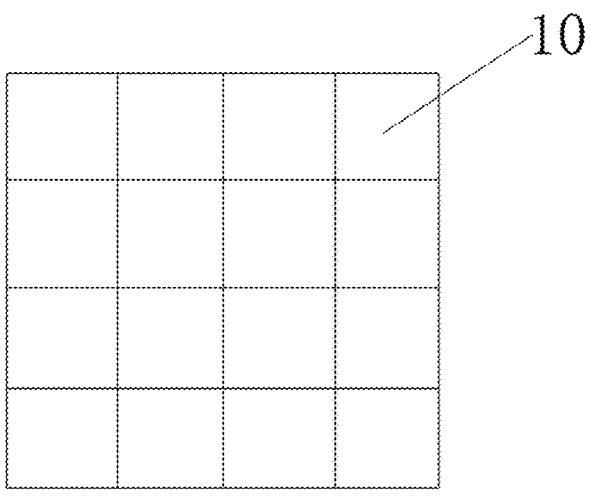
FIG. 12 shows a schematic structural diagram of a display panel motherboard in an embodiment of the present disclosure.

In the manufacturing method of the display panel in this embodiment, first, a temporary release film mother layer is adhered to the second surface of the substrate 301 of the display panel motherboard 10, which is for protecting the substrate 301. The display panel motherboard 10 should be understood as a motherboard including a plurality of display panels. The motherboard may be cut into a plurality of independent display panels by cutting in subsequent processes. The structure of the display panel motherboard 10 may be as shown in FIG. 12.

S402, adhering a first support portion mother layer on the first surface of the substrate of the display panel motherboard 10 opposite to the second surface, wherein the first support portion mother layer includes a first support base material mother layer and a first adhesive material mother layer which are stacked, the first adhesive material mother layer adheres the first support base material mother layer on the second surface, and a material adhesion of the first adhesive material mother layer makes the first adhesive material mother layer easy to be stripped but not easy after being irradiated by UV light.

The material adhesion of the first adhesive material mother layer makes it easy to be stripped, but it becomes difficult to be stripped after being irradiated by UV light. After being irradiated by UV light, the adhesion of the first adhesive material mother layer is correspondingly enhanced.

S403, cutting the first support portion mother layer, the display panel motherboard 10 and the temporary release film mother layer perpendicular to the first surface of the substrate 301 of the display panel motherboard 10 to form a plurality of independent display panels, wherein the first support portion layer is adhered to the first surface of the substrate 301 of the display panel, and a temporary release film is adhered to the second surface of a flexible substrate 301 of the display panel, and the first support portion layer includes a first support base material layer and a first adhesive material layer which are stacked.

Figure 13:
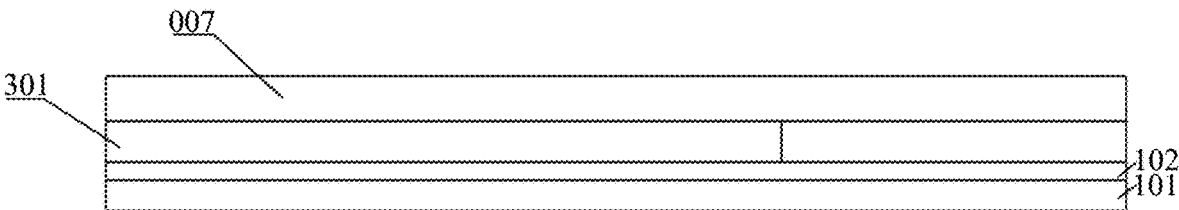
FIGS. 13 to 17 show a flowchart of a manufacturing method of a display panel in an embodiment of the present disclosure.

After adhering the first support portion mother layer, in order to form a plurality of independent display panels, the display panel motherboard 10 may be cut. In the cutting process, the first support portion mother layer adhered to the first surface of the substrate 301 of the display panel motherboard 10, the display panel motherboard 10, and the temporary release film mother layer adhered to the second surface of the substrate 301 of the display panel motherboard 10 may all be cut to form independent display panels. As shown in FIG. 13, the first surface of the substrate 301 of each independent display panel is adhered with a first support portion layer formed by the cut first support portion mother layer, and correspondingly, the second surface of the substrate 301 of each independent display panel is adhered with a temporary release film 007 formed by the cut temporary release film mother layer.

S404, removing the temporary release film 007 and forming a functional module layer on the second surface of the substrate 301 of the display panel.

Figure 14:
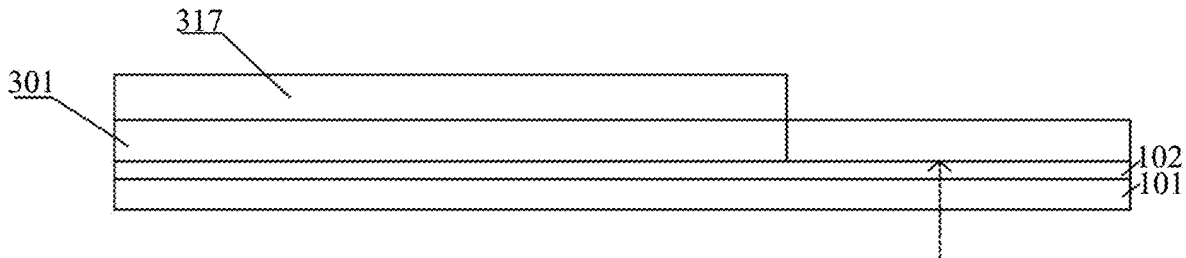

After the cutting is completed, a functional module layer is formed on the second surface of the substrate 301 of the display panel. In the example of FIG. 14, the functional module layer includes a polarizer 317.

S405, cutting the first support portion layer perpendicular to the first surface of the substrate 301 of the display panel, wherein a cutting site is located in the bonding area.

Figure 15:
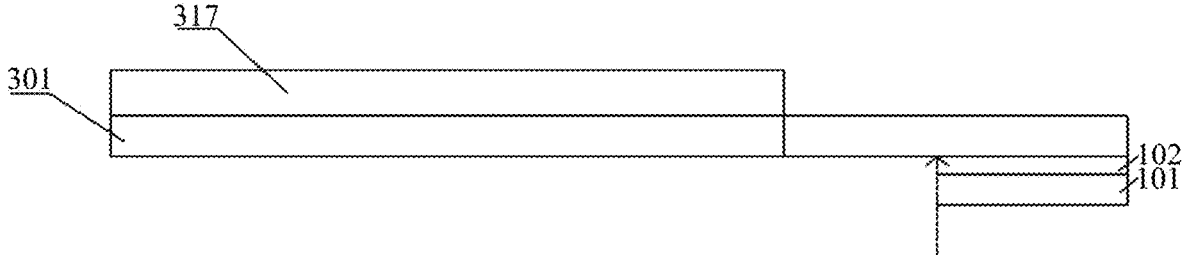

In order to reserve a position for a second support portion on the substrate 301 of the display panel, the first support portion layer is cut, and the cutting position of the first support portion layer may be at the dotted line as shown in FIG. 15.

S406, stripping a portion of the first support portion layer, and remaining only a portion located in the bonding area from the cutting site to form the first support portion.

After the cutting is completed, as shown in FIG. 15, since the material adhesion of the first adhesive material layer makes the first adhesive material layer easy to be stripped, the portion located in the bonding area from the cutting site may be remained to form the first support portion, and the rest of the first adhesive material layer may be stripped to reserve a position for a second support portion on the substrate 301 of the display panel.

S407, adhering the second support portion on the first surface, wherein the second support portion includes a second support base material 201 and a second adhesive material 202 which are stacked, and the groove 003 is formed between the first support portion and the second support portion.

Figure 16:
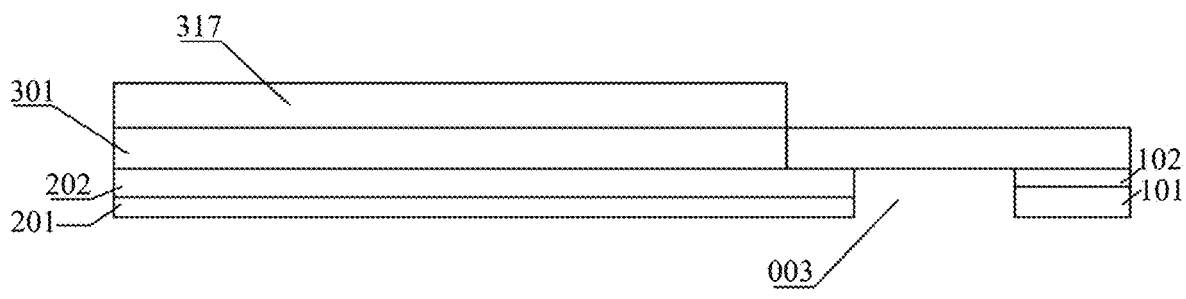

Optionally, in the process of adhering the second support portion to the first surface of the substrate 301 of the display panel, a corresponding support film is first designed according to the type of the display panel. For example, when the display panel is a folded display panel, the specification may be set as a support film with the elastic modulus of the second support base material 201 ranging from 100 Gpa to 400 Gpa, and when the display panel is a curved display panel, the specification may be selected as a support film with the elastic modulus of the second support base material 201 ranging from 10 Mpa to 500 Mpa. After the selection is completed, the corresponding second support portion may be adhered on the first surface as shown in FIG. 16.

S408, irradiating the first support portion with UV light to increase an adhesion of the first support portion.

Figure 17:
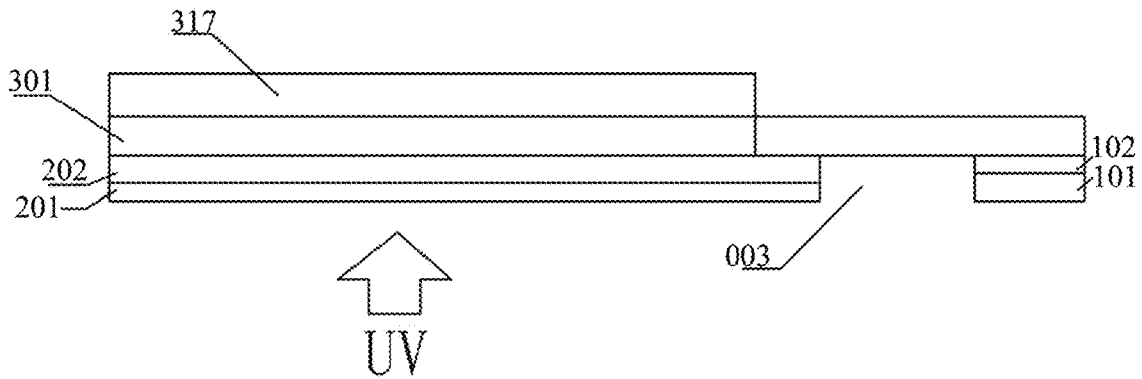

After adhering the second support portion, since the material adhesion of the first adhesive material layer of the first support portion makes it easy to be stripped, in order to increase the adhesion of the first support portion, as shown in FIG. 17, the first support portion is irradiated with UV light to increase the adhesion of the first support portion. The increase in the adhesion of the first support portion should be understood as the increase in the adhesion of the first adhesive material 102 in the first support portion.

S409, forming an electronic device 006 on the second surface of the substrate 301 corresponding to the bonding area of the display panel.

After the treatment with UV irradiation, an electronic device 006 is formed on the second surface of the substrate 301 corresponding to the bonding area of the display panel, thereby forming the structure of the display panel as shown in FIG. 9.

In this embodiment, the first support portion is irradiated with UV light so as to increase the adhesion of the first support portion, thereby ensuring that the first support portion is fixed with the substrate 301 and has good bonding process performance.

In this embodiment, the adhesion of the first adhesive material 102 before being irradiated by UV light may be less than 15 gf/Inch, while the adhesion after being irradiated by UV light may be greater than 400 gf/Inch or greater than 1500 gf/Inch. The greater the adhesion, the firmer the fixation.

FIG. 18 shows a flowchart of steps of a manufacturing method of a display panel according to another embodiment of the present disclosure. As shown in FIG. 18, the manufacturing method includes the following steps:

S501, adhering a temporary release film mother layer on the second surface of the substrate 301 of a display panel motherboard 10, wherein the display panel motherboard 10 includes a plurality of display panels arranged in an array.

In the manufacturing method of the display panel in this embodiment, first, a temporary release film mother layer is adhered to the second surface of the substrate 301 of the display panel motherboard 10, which is for protecting the substrate 301. The display panel motherboard 10 should be understood as a motherboard including a plurality of display panels. The motherboard may be cut into a plurality of independent display panels by cutting in subsequent processes.

S502, adhering a first support portion mother layer on the first surface of the substrate 301 of the display panel motherboard 10 opposite to the second surface, wherein the first support portion mother layer includes a first support base material mother layer and a first adhesive material mother layer which are stacked, the first adhesive material mother layer adheres the first support base material mother layer on the first surface, and a material adhesion of the first adhesive material mother layer makes the first adhesive material mother layer not easy to be stripped but easy after being irradiated by UV light;

The material adhesion of the first adhesive material mother layer makes it not easy to be stripped, but easy after being irradiated by UV light. After being irradiated by UV light, the adhesion of the first adhesive material mother layer is correspondingly weakened.

S503, cutting the first support portion mother layer, the display panel motherboard 10 and the temporary release film mother layer perpendicular to the first surface of the substrate 301 of the display panel motherboard 10 to form a plurality of independent display panels, wherein the first support portion layer is adhered to the first surface of the substrate 301 of the display panel, and a temporary release film is adhered to the second surface of a flexible substrate 301 of the display panel, and the first support portion layer includes a first support base material layer and a first adhesive material layer which are stacked.

After adhering the first support portion mother layer, in order to form a plurality of independent display panels, the display panel motherboard 10 is cut. In the cutting process, the first support portion mother layer adhered to the first surface of the substrate 301 of the display panel motherboard 10, the display panel motherboard 10, and the temporary release film mother layer adhered to the second surface of the substrate 301 of the display panel motherboard 10 are all cut to form independent display panels. The first surface of the substrate 301 of each independent display panel is adhered with a first support portion layer formed by the cut first support portion mother layer, and correspondingly, the second surface of the substrate 301 of each independent display panel is adhered with a temporary release film 007 formed by the cut temporary release film mother layer.

S504, removing the temporary release film 007 and forming an electronic device 006 on the second surface of the substrate 301 corresponding to the bonding area of the display panel.

Figure 19:
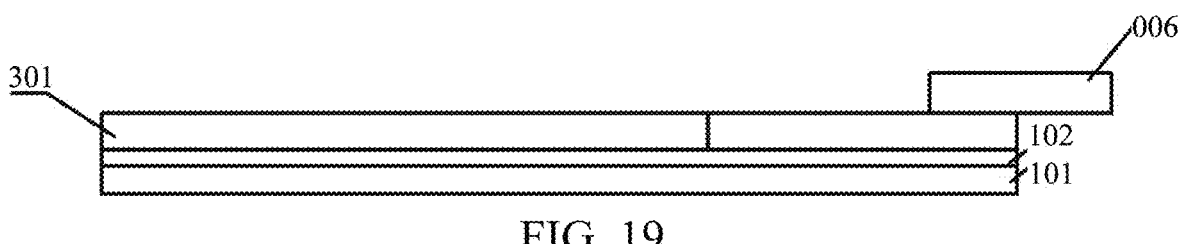
FIGS. 19 to 23 show a flowchart of a manufacturing method of a display panel in an embodiment of the present disclosure.

For example, in FIG. 19, after removing the temporary release film 007, the electronic device 006 is formed on the second surface of the substrate 301 corresponding to the bonding area of the display panel.

S505, cutting the first support portion layer perpendicular to the first surface of the substrate 301 of the display panel, wherein a cutting site is located in the bonding area.

Figure 20:
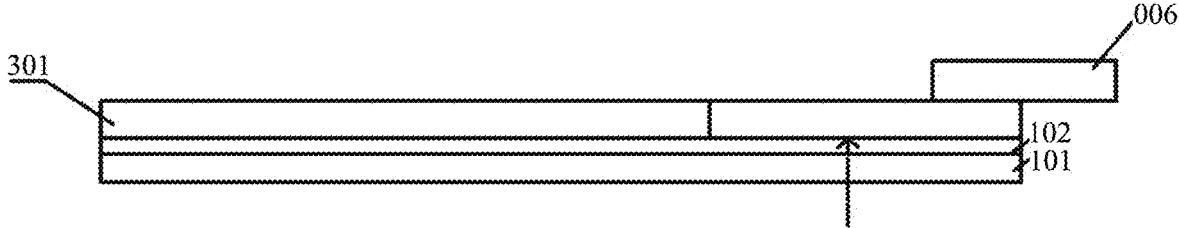

In order to reserve a position for a second support portion on the substrate 301 of the display panel, the first support portion layer is cut, and in FIG. 20, the cutting position may be shown as the dotted arrow.

S506, irradiating the first support portion layer corresponding to the display area from the cutting site with UV light to reduce the adhesion of the irradiated first support portion layer.

Figure 21:
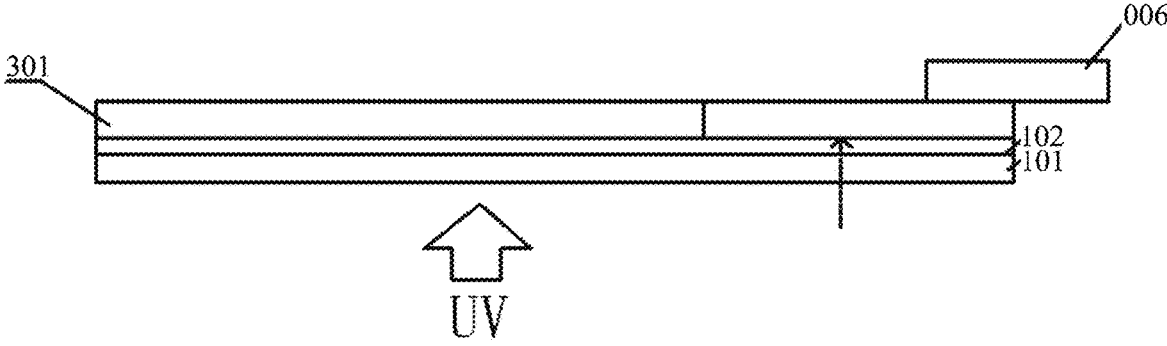

After the cutting is completed, since the material adhesion of the first adhesive material layer makes it not easy to be stripped, as shown in FIG. 21, the first support portion corresponding to the display area from the cutting site is irradiated with UV light so as to reduce the material adhesion of the first support portion layer in this portion and make it easy to be stripped.

S507, stripping the irradiated first support portion layer, and forming a remaining portion into the first support portion.

Figure 22:
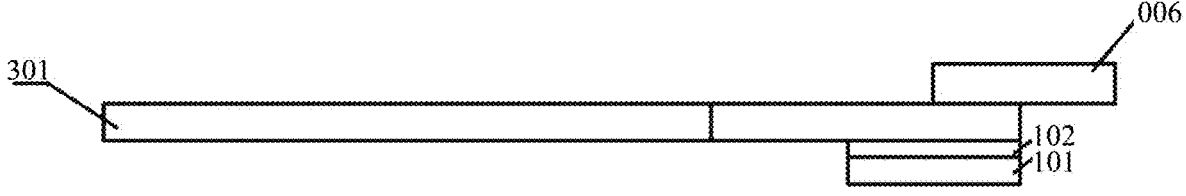

After irradiation, the adhesion of the first adhesive material layer makes it easy to be stripped. As shown in FIG. 22, the portion located in the bonding area from the cutting site may be remained to form the first support portion, and the rest portion is stripped so as to reserve a position for a second support portion on the substrate 301 of the display panel.

S508, adhering the second support portion on the first surface, wherein the second support portion includes a second support base material 201 and a second adhesive material 202 which are stacked, and the groove 003 is formed between the first support portion and the second support portion.

Figure 23:
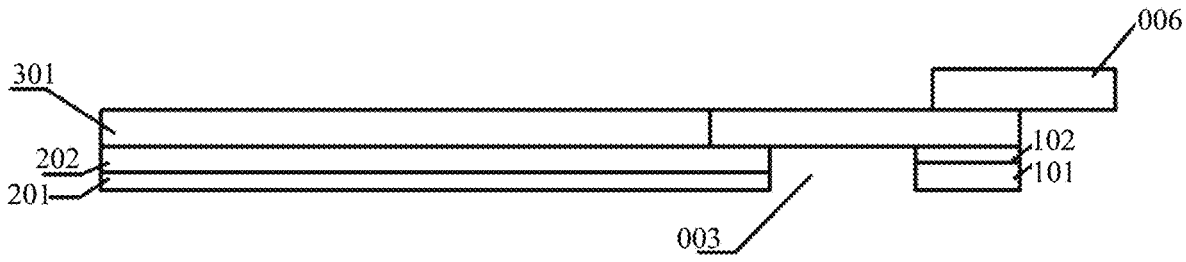

In the process of adhering the second support portion to the first surface of the substrate 301 of the display panel, a corresponding support film is first designed according to the type of the display panel. For example, when the display panel is a folded display panel, the specification may be set as a support film with the elastic modulus of the second support base material 201 ranging from 100 Gpa to 400 Gpa, and when the display panel is a curved display panel, the specification may be selected as a support film with the elastic modulus of the second support base material 201 ranging from 10 Mpa to 500 Mpa. After the selection is completed, the corresponding second support portion may be adhered on the first surface as shown in FIG. 23.

S509, forming a functional module layer on the second surface of the substrate 301 of the display panel.

After the adhering is completed, a functional module layer is formed on the second surface of the substrate 301 of the display panel, thereby forming the structure of the display panel as shown in FIG. 9.

In this embodiment, since the UV light irradiation on the first support film is completed before the functional module layer is formed, the process influence on the functional module layer is reduced and the yield of products is improved.

In this embodiment, the adhesion of the first adhesive material 102 after being irradiated by UV light may be less than 15 gf/Inch, while the adhesion before being irradiated by UV light may be greater than 400 gf/Inch or greater than 1500 gf/Inch. The greater the adhesion, the firmer the fixation.

The above embodiments of the present disclosure are only examples for explaining the present disclosure, but are not a limitation of the implementation of the present disclosure. For those ordinary skilled in the art, other changes or variations in different forms may be made on the basis of the above description, and all the implementations may not be exhaustive here. All obvious changes or variations derived from the technical schemes of the present disclosure are still within the scope of protection of the present disclosure.

The invention claimed is:

1. A support film for a flexible display panel, the display panel comprising a display area and a bonding area, wherein the support film comprises:

a first support portion and a second support portion which are juxtaposed on a first surface of a substrate of the display panel, wherein the first support portion is located in the bonding area, the second support portion extends from the display area to the bonding area, and a groove is provided between the first support portion and the second support portion to expose the first surface, wherein, the first support portion comprises:

a first support base material and a first adhesive material which are stacked, wherein the first adhesive material adheres the first support base material on the first surface;

the second support portion comprises:

a second support base material and a second adhesive material which are stacked, wherein the second adhesive material adheres the second support base material on the first surface, wherein the first support base material has an elastic modulus different from that of the second support base material, the first support base material has a thickness different from that of the second support base material, and the first support portion has a thickness equal to that of the second support portion.

2. The support film according to claim 1, wherein the elastic modulus of the first support base material is 2 Gpa to 8 Gpa, and an elastic modulus of the first adhesive material is 100 Kpa to 400 Kpa;

in a case where the display panel is a curved display panel, the elastic modulus of the second support base material is 10 Mpa to 500 Mpa;

in a case where the display panel is a folded display panel, the elastic modulus of the second support base material is 100 Gpa to 400 Gpa; and an elastic modulus of the second adhesive material is 1 Kpa to 400 Kpa.

3. The support film according to claim 2, wherein the first support base material is made of a polyester resin material, and the second support base material is made of a metal material or a polymer material.

4. The support film according to claim 1, wherein a transmittance of the first support base material for visible light is not less than 30%.

5. The support film according to claim 1, wherein in a case that the elastic modulus of the first support base material is smaller than that of the second support base material, the thickness of the second support base material is smaller than that of the first support base material, a thickness of the second adhesive material is greater than that of the first adhesive material, and a sum of the thicknesses of the first support base material and the first adhesive material is the same as that of the second support base material and the second adhesive material.

6. A forming method of the support film according to claim 1, comprising:

adhering a first support portion layer on the first surface, wherein the first support portion layer comprises a first support base material layer and a first adhesive material layer which are stacked, the first adhesive material layer adheres the first support base material layer on the first surface, and a material adhesion of the first adhesive material layer makes the first adhesive material layer easy to be stripped but not easy after being irradiated by ultraviolet (UV) light;

cutting the first support portion layer perpendicular to the first surface, wherein a cutting site is located in the bonding area;

stripping a portion of the first support portion layer, and remaining only a portion located in the bonding area from the cutting site to form the first support portion;

adhering the second support portion on the first surface, wherein the second support portion comprises the second support base material and the second adhesive material which are stacked, and the groove is formed between the first support portion and the second support portion; and irradiating the first support portion with UV light to increase an adhesion of the first support portion.

7. A forming method of the support film according to claim 1, comprising:

adhering a first support portion layer on the first surface, wherein the first support portion layer comprises a first support base material layer and a first adhesive material layer which are stacked, the first adhesive material layer adheres the first support base material layer on the first surface, and a material adhesion of the first adhesive material layer makes the first adhesive material layer not easy to be stripped but easy after being irradiated by ultraviolet (UV) light;

cutting the first support portion layer perpendicular to the first surface, with a cutting site in the bonding area;

irradiating the first support portion layer corresponding to the display area from the cutting site with UV light to reduce an adhesion of the irradiated first support portion layer;

stripping the irradiated first support portion layer, and forming a remaining portion into the first support portion; and adhering the second support portion on the first surface, wherein the second support portion comprises the second support base material and the second adhesive material which are stacked, and the groove is formed between the first support portion and the second support portion.

8. A display panel, comprising:

a substrate;

the support film according to claim 1 formed on a first surface of the substrate; and a functional module layer formed on a second surface of the substrate opposite to the first surface.

9. The manufacturing method of the display panel according to claim 8, comprising:

adhering a temporary release film mother layer on a second surface of a substrate of a display panel motherboard, wherein the display panel motherboard comprises a plurality of display panels arranged in an array;

adhering a first support portion mother layer on a first surface of the substrate of the display panel motherboard opposite to the second surface, wherein the first support portion mother layer comprises a first support base material mother layer and a first adhesive material mother layer which are stacked, the first adhesive material mother layer adheres the first support base material mother layer on the first surface, and a material adhesion of the first adhesive material mother layer makes the first adhesive material mother layer easy to be stripped but not easy after being irradiated by ultraviolet (UV) light;

cutting the first support portion mother layer, the display panel motherboard and the temporary release film mother layer perpendicular to the first surface of the substrate of the display panel motherboard to form a plurality of independent display panels, wherein a first support portion layer is adhered to the first surface of the substrate of the display panel, and a temporary release film is adhered to the second surface of a flexible substrate of the display panel, and the first support portion layer comprises a first support base material layer and a first adhesive material layer which are stacked;

removing the temporary release film and forming the functional module layer on the second surface of the substrate of the display panel;

cutting the first support portion layer perpendicular to the first surface of the substrate of the display panel, wherein a cutting site is located in the bonding area;

stripping a portion of the first support portion layer, and remaining only a portion located in the bonding area from the cutting site to form the first support portion;

adhering the second support portion on the first surface, wherein the second support portion comprises the second support base material and the second adhesive material which are stacked, and the groove is formed between the first support portion and the second support portion;

irradiating the first support portion with UV light to increase an adhesion of the first support portion; and forming an electronic device on the second surface of the substrate corresponding to the bonding area of the display panel.

10. The manufacturing method of the display panel according to claim 8, comprising:

adhering a temporary release film mother layer on a second surface of a substrate of a display panel motherboard, wherein the display panel motherboard comprises a plurality of display panels arranged in an array;

adhering a first support portion mother layer on a first surface of the substrate of the display panel motherboard opposite to the second surface, wherein the first support portion mother layer comprises a first support base material mother layer and a first adhesive material mother layer which are stacked, the first adhesive material mother layer adheres the first support base material mother layer on the first surface, and a material adhesion of the first adhesive material mother layer makes the first adhesive material mother layer not easy to be stripped but easy after being irradiated by UV light;

cutting the first support portion mother layer, the display panel motherboard and the temporary release film mother layer perpendicular to the first surface of the substrate of the display panel motherboard to form a plurality of independent display panels, wherein a first support portion layer is adhered to the first surface of the substrate of the display panel, and a temporary release film is adhered to the second surface of a flexible substrate of the display panel, and the first support portion layer comprises a first support base material layer and a first adhesive material layer which are stacked;

removing the temporary release film and forming an electronic device on the second surface of the substrate corresponding to the bonding area of the display panel;

cutting the first support portion layer perpendicular to the first surface of the substrate of the display panel, wherein a cutting site is located in the bonding area;

irradiating the first support portion layer corresponding to the display area from the cutting site with UV light to reduce an adhesion of the irradiated first support portion layer;

stripping the irradiated first support portion layer, and forming a remaining portion into the first support portion;

adhering the second support portion on the first surface, wherein the second support portion comprises the second support base material and the second adhesive material which are stacked, and the groove is formed between the first support portion and the second support portion; and forming the functional module layer on the second surface of the substrate of the display panel.

11. A support film for a flexible display panel, comprising:

a release film;

a first support portion and a second support portion which are juxtaposed on a first surface of the release film, wherein a groove is provided between the first support portion and the second support portion to expose the first surface, wherein the first support portion comprises:

a first support base material and a first adhesive material which are stacked, wherein the first adhesive material adheres the first support base material on the first surface;

the second support portion comprises:

a second support base material and a second adhesive material which are stacked, wherein the second adhesive material adheres the second support base material on the first surface, wherein the first support base material has an elastic modulus different from that of the second support base material, the first support base material has a thickness different from that of the second support base material, and the first support portion has a thickness equal to that of the second support portion.

12. The support film according to claim 11, further comprising:

a protective film adhered to a side of the first support portion and a side of the second support portion away from the release film.

13. The support film according to claim 11, wherein the elastic modulus of the first support base material is 2 Gpa to 8 Gpa, and an elastic modulus of the first adhesive material is 100 Kpa to 400 Kpa;

in a case where the display panel is a curved display panel, the elastic modulus of the second support base material is 10 Mpa to 500 Mpa;

in a case where the display panel is a folded display panel, the elastic modulus of the second support base material is 100 Gpa to 400 Gpa; and an elastic modulus of the second adhesive material is 1 Kpa to 400 Kpa.

14. The support film according to claim 11, wherein a transmittance of the first support base material for visible light is not less than 30%.

15. The support film according to claim 11, wherein in a case that the elastic modulus of the first support base material is smaller than that of the second support base material, the thickness of the second support base material is smaller than that of the first support base material, a thickness of the second adhesive material is greater than that of the first adhesive material, and a sum of the thicknesses of the first support base material and the first adhesive material is the same as that of the second support base material and the second adhesive material.

16. A manufacturing method of the support film according to claim 11, comprising:

stacking the first support base material and the first adhesive material to obtain the first support portion;

stacking the second support base material and the second adhesive material to obtain the second support portion;

juxtaposing the first support portion and the second support portion on a first surface of a release film, wherein a first interval is provided between the first support portion and the second support portion;

punching the first support portion and the second support portion in alignment with the first interval to form a second interval with a width greater than that of the first interval, thereby forming the groove; and fully cutting the first support portion and the release film at a side of the first support portion away from the second support portion, and fully cutting the second support portion and the release film at a side of the second support portion away from the first support portion, thereby forming the support film conforming to size specifications.

17. The manufacturing method of the support film according to claim 16, further comprising:

adhering a protective film on a side of the first support portion and a side of the second support portion away from the release film.

* * * * *